(12) United States Patent
Jaimsomporn et al.

(10) Patent No.: US 6,472,895 B2
(45) Date of Patent: Oct. 29, 2002

(54) METHOD AND SYSTEM FOR ADAPTING BURN-IN BOARDS TO MULTIPLE BURN-IN SYSTEMS

(75) Inventors: Yong Jaimsomporn, Nonthaburi (TH); Tanawat Boutngam, Nonthaburi (TH); Narupon Tabtimted, Patumtanee (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/732,031

(22) Filed: Dec. 6, 2000

(65) Prior Publication Data

US 2002/0067180 A1 Jun. 6, 2002

(51) Int. Cl.[7] .............................................. G01R 31/02
(52) U.S. Cl. ..................................... 324/760; 324/158.1
(58) Field of Search ............................. 324/760, 158.1, 324/73.1; 361/415, 383

(56) References Cited

U.S. PATENT DOCUMENTS

| | | | | |
|---|---|---|---|---|
| 4,145,620 A | * | 3/1979 | Dice ........................... 324/73.1 |
| 4,636,726 A | * | 1/1987 | Santomango et al. ..... 324/158.1 |
| 4,683,424 A | * | 7/1987 | Cutright et al. ........... 324/158.1 |
| 4,695,707 A | * | 9/1987 | Young ........................ 324/158.1 |
| 4,777,434 A | * | 10/1988 | Miller et al. ............... 324/158.1 |
| 4,900,948 A | * | 2/1990 | Hamilton ..................... 324/73.1 |
| 4,949,031 A | * | 8/1990 | Szasz et al. ............... 324/158.1 |
| 5,003,156 A | * | 3/1991 | Kilpatrick et al. ........ 324/158.1 |
| 5,072,177 A | * | 12/1991 | Liken et al. ............... 324/158.1 |
| 5,103,168 A | * | 4/1992 | Fuoco ........................ 324/158.1 |
| 5,402,078 A | * | 3/1995 | Hamilton ..................... 324/760 |
| 5,528,161 A | * | 6/1996 | Liken et al. ................. 324/760 |
| 5,672,981 A | * | 9/1997 | Fehrman ...................... 324/760 |
| 5,966,021 A | * | 10/1999 | Eliashberg et al. .......... 324/760 |
| 6,075,698 A | * | 5/2000 | Heo et al. .................... 324/760 |
| 6,157,201 A | * | 12/2000 | Leung, Jr. ................... 324/760 |
| 6,169,413 B1 | * | 1/2001 | Paek et al. .................. 324/760 |
| 6,229,325 B1 | * | 5/2001 | Browning et al. ............ 324/760 |

* cited by examiner

*Primary Examiner*—Michael Sherry
*Assistant Examiner*—Jimmy Nguyen
(74) *Attorney, Agent, or Firm*—Sawyer Law Group LLP

(57) ABSTRACT

A method and system for providing an adapter system for use with a first burn-in system is disclosed. The first burn-in system includes a heating chamber and a plurality of burn-in boards for use in the heating chamber. Each of the plurality of burn-in boards is for holding a plurality of semiconductor devices for testing in the first burn-in system. Each of the plurality of burn-in boards has a first connector for receiving a plurality of signals for a first portion of the plurality of semiconductor devices. Each of the plurality of signals is received in a first corresponding portion of the first connector. The method and system include providing an adaptor card for use with the first burn-in system and a driver board for a second burn-in system. The driver board is incompatible with the first burn-in system and has a second connector for outputting the plurality of signals. Each of the plurality of signals is provided in a second corresponding portion of the second connector. The adaptor card includes a scrambling circuit for providing an interface between the second connector and the first connector such that each of the plurality of signals can be provided from the second corresponding portion of the second connector to the first corresponding portion of the first connector of at least one burn-in board of the plurality of burn-in boards. Thus, the adaptor card allows the driver board to be used in the first burn-in system.

16 Claims, 3 Drawing Sheets

METHOD AND SYSTEM FOR ADAPTING BURN-IN BOARDS TO MULTIPLE BURN-IN SYSTEMS

FIELD OF THE INVENTION

The present invention relates to processing and testing of semiconductor devices, and more particularly to a method and system for adapting boards used in one burn-in system to another, otherwise incompatible burn-in system.

BACKGROUND OF THE INVENTION

High temperature operating life ("HTOL") reliability stress testing of semiconductor devices is employed to determine the reliability of semiconductor devices. HTOL utilizes conventional burn-in systems. FIG. 1 depicts such a conventional burn-in system 10. The conventional burn-in system includes an oven 26 having a fan 30 run by a motor 28, a heater 32 and connector sockets 34 and 36. The conventional burn-in system to also includes conventional driver boards and conventional burn-in boards. For clarity, only a single conventional burn-in board 12 and a single driver board 18 are shown. The conventional burn-in board 12 includes multiple sockets 14 into which semiconductor devices to be tested (not shown) are plugged. The conventional burn-in board 12 plugs into the connector socket 34 within the conventional oven 26 via the conventional burn-in board's connector 16. The conventional driver board 18 is used to provide signals from the outside to the semiconductor devices being tested. The conventional driver board 18 typically includes a clock signal circuit 20, which generates the signals to be provided to the semiconductor devices during the HTOL reliability stress test. In certain conventional burn-in systems, such as the AEHR Test 800 system, the conventional driver board 18 may also include a bias voltage generating circuit 22. In the AEHR Test 800 driver board, the bias voltage generated is a DC voltage. However, conventional driver boards for other conventional burn-in systems, such as the Criteria Rel. Inc. CR-V system, do not have a bias voltage generating circuit on the conventional driver board 18. The conventional driver board 18 plugs into the connector socket 36 outside the conventional oven 26 via the conventional driver board's connector 24. Thus, in the conventional system 10, the connectors 16 and 24 are configured to be received by the connector sockets 34 and 36, respectively. Note that although a single conventional driver board 18 is shown as driving a single conventional burn-in board 12, in some conventional burn-in systems, the conventional driver board 18 drivers multiple conventional burn-in boards 12. For example, in the Criteria Rel. Inc. CR-V systems, the conventional driver board 18 drives four conventional burn-in boards 12.

Once the conventional driver board 18 and the conventional burn-in board 12 are plugged in, HTOL stress reliability testing can commence. The conventional oven 26 can be heated, typically to between one hundred twenty-five and one hundred fifty degrees Centigrade. During the test, the bias voltage and signals are provided from the conventional driver board 18 to the conventional burn-in board 12 and, therefore, to the semiconductor devices plugged into the sockets 14.

Although the conventional system 10 functions, one of ordinary skill in the art will readily recognize that the conventional system 10 is not very flexible. In particular, the conventional driver board 18 and the conventional burn-in board 12 are specific to the conventional burn-in system 10 for which they are manufactured. In addition, the conventional driver board 18 is specific to the semiconductor devices for which it was manufactured. The conventional driver board 18 and the conventional burn-in board 12 are provided by the manufacturer of the conventional burn-in system 10. Thus, the configurations of the pins for the connector 24 and for the connector 16 are specific to the particular conventional burn-in system for which the conventional driver board 18 and the conventional burn-in board 12, respectively, are manufactured. Thus, the conventional driver boards 18 for different manufacturers' conventional burn-in systems 10 are not interchangeable. Similarly, the conventional burn in boards 12 for different manufacturers' conventional burn-in systems 10 are not interchangeable. In addition, a conventional driver board 18 provides signals for the semiconductor devices desired to be tested. These signals are typically specific to certain semiconductor devices. For example, the conventional driver board 18 provided by the manufacturer includes the circuitry, such as the clock signal circuit 20 and possibly the bias voltage generating circuit 22, required to test specific devices. Consequently, a conventional driver board 18 for certain semiconductor devices cannot be used with different semiconductor devices.

Because the conventional burn-in board 12 and the conventional driver board 18 are specific to certain conventional burn-in systems 10 and because the conventional driver board 18 is specific to certain semiconductor devices, the conventional burn-in system 10 is not flexible. For example, the conventional burn-in system 10 is typically large and very expensive. Thus, different locations for a semiconductor device manufacturer may have different conventional burn-in systems 10. Each conventional burn-in system has its own conventional burn-in boards 12 and driver boards 18. The same semiconductor device may be desired to be tested at different locations having different conventional burn-in systems 10 or by different conventional burn-in systems 10 at the same location. In order to test the same semiconductor devices using a different manufacturers' conventional burn-in system 10, a new conventional driver board 18 must be ordered for the different conventional burn-in system 10. Such a board is very expensive. For example, a typical conventional driver board 18 may cost as much as $10,000. Ordering and receiving a new conventional driver board 18 also takes a finite amount of time. Thus, testing of semiconductor devices is made more expensive and difficult because of the limited flexibility of the conventional burn-in system 10.

The fact that some conventional burn-in boards 12 contain scrambling circuits (not shown) does not change this conclusion. Such a scrambling circuit is for changing the pins of the semiconductor devices being tested to which signals are provided. This allows for some increased flexibility in the semiconductor devices being tested and the tests performed on such semiconductor devices. However, such a scrambling circuit cannot render a different conventional driver board 18 compatible with the conventional burn-in system 10. Such a scrambling circuit may not be able to account for the different pin configuration of the conventional driver board 18. In addition, such a scrambling circuit may not affect the ability of the connector 24 of the conventional driver board 18 to adequately couple to the connector socket 36. Thus, the conventional driver board 18 of one manufacturer is still incompatible with the conventional burn-in system 10 of another manufacturer. Thus, testing of semiconductor devices on another manufacturer's conventional burn-in system is still subject to the problems discussed above.

Accordingly, what is needed is a system and method for making burn-in systems more flexible. The present invention addresses such a need.

SUMMARY OF THE INVENTION

The present invention provides a method and system for providing an adapter system for use with a first burn-in system. The first burn-in system includes a heating chamber and a plurality of burn-in boards for use in the heating chamber. Each of the plurality of burn-in boards is for holding a plurality of semiconductor devices for testing in the first burn-in system. Each of the plurality of burn-in boards has a first connector for receiving a plurality of signals for a first portion of the plurality of semiconductor devices. Each of the plurality of signals is received in a first corresponding portion of the first connector. The method and system comprise providing an adaptor card for use with the first burn-in system and a driver board for a second burn-in system. The driver board is incompatible with the first burn-in system and has a second connector for outputting the plurality of signals. Each of the plurality of signals is provided in a second corresponding portion of the second connector. The adaptor card includes a scrambling circuit for providing an interface between the second connector and the first connector such that each of the plurality of signals can be provided from the second corresponding portion of the second connector to the first corresponding portion of the first connector of at least one burn-in board of the plurality of burn-in boards. Thus, the adaptor card allows the driver board to be used in the first burn-in system.

According to the system and method disclosed herein, the present invention provides a mechanism for using the driver board of one burn-in system with a second, incompatible burn-in system.

DETAILED DESCRIPTION OF THE INVENTION

Figure 1:
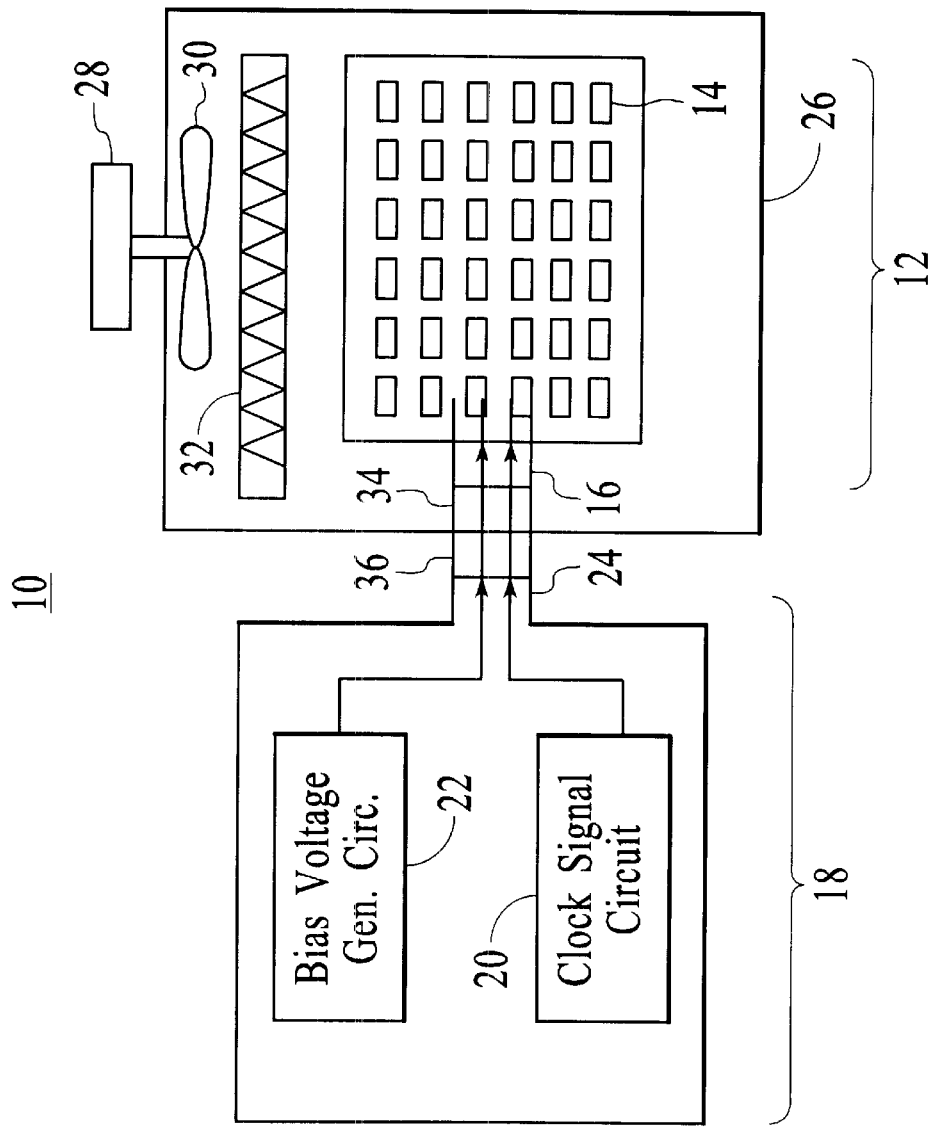
FIG. 1 is a block diagram of a conventional burn-in system.

The present invention relates to an improvement in apparatus for testing semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional burn-in systems are utilized in HTOL reliability stress testing. Such conventional burn-in systems utilize conventional driver boards for providing signals and, in some cases, bias voltages to the semiconductor devices under test. The semiconductor devices are loaded into sockets on conventional burn-in boards which are placed in the oven of the conventional burn-in system during test. The signals and bias voltages are provided by coupling a connector of the conventional driver board to a first connector socket on the outside of the oven for the conventional burn-in system. The conventional burn-in boards are connected to a second socket inside the oven via a connector on the conventional burn-in boards. The connectors for the conventional driver boards and burn-in boards are specific to the system for which the conventional driver boards and conventional burn-in boards are designed. As a result, the signals from the conventional driver boards are provided to the appropriate pins on the semiconductor devices on the conventional burn-in boards.

Although the conventional burn-in system functions, one of ordinary skill in the art will readily recognize that the conventional burn-in system has limited flexibility. In particular, because different manufacturers' conventional driver boards and conventional burn-in boards are not interchangeable, new conventional driver boards must be ordered when testing semiconductor devices on a new conventional burn in system. Obtaining new conventional driver boards is expensive and requires a finite amount of time. Therefore, testing of semiconductor devices is made more expensive.

The present invention provides a method and system for providing an adapter system for use with a first burn-in system. The first burn-in system includes a heating chamber and a plurality of burn-in boards for use in the heating chamber. Each of the plurality of burn-in boards is for holding a plurality of semiconductor devices for testing in the first burn-in system. Each of the plurality of burn-in boards has a first connector for receiving a plurality of signals for a first portion of the plurality of semiconductor devices. Each of the plurality of signals is received in a first corresponding portion of the first connector. The method and system comprise providing an adaptor card for use with the first burn-in system and a driver board for a second burn-in system. The driver board is incompatible with the first burn-in system and has a second connector for outputting the plurality of signals. Each of the plurality of signals is provided in a second corresponding portion of the second connector. The adaptor card includes a scrambling circuit for providing an interface between the second connector and the first connector such that each of the plurality of signals can be provided from the second corresponding portion of the second connector to the first corresponding portion of the first connector of at least one burn-in board of the plurality of burn-in boards. Thus, the adaptor card allows the driver board to be used in the first burn-in system.

The present invention will be described in terms of certain burn-in systems and properties of driver boards and burn-in boards. However, one of ordinary skill in the art will readily recognize that this method and system will operate effectively for other burn-in systems and other driver boards and burn-in boards having other properties.

Figure 2:
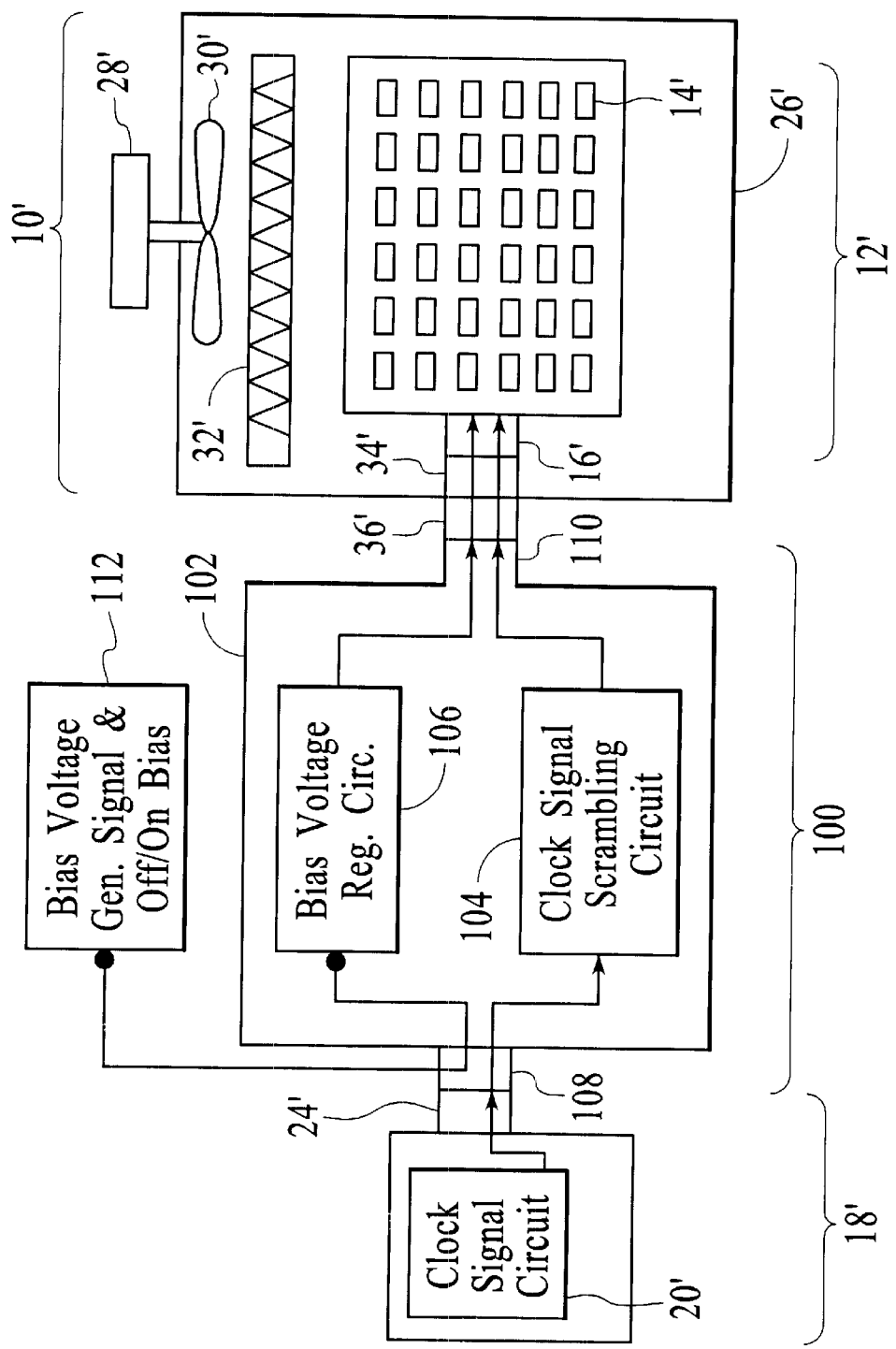
FIG. 2 is a block diagram of one embodiment of the adapter system in accordance with the present invention as used with a conventional burn-in system and driver board.

To more particularly illustrate the method and system in accordance with the present invention, refer now to FIG. 2, depicting a block diagram of one embodiment of the adapter system 100 in accordance with the present invention as used with a conventional burn-in system 10' and driver board 18'. The conventional burn in system 10' includes a conventional burn in board 14', a conventional oven 26', a conventional motor 28', a conventional heat and 32' and a conventional fan 30'. The conventional oven 26' also includes connector sockets 34' and 36'. The conventional burn in board 12' includes sockets 14' for holding semiconductor devices to be tested. The conventional burn in board 12' plugs into the connector sockets 34'. Thus, the conventional burn in system 10' functions a matter similar to the conventional burn in system 10 depicted in FIG. 1. Referring back to FIG. 2, a conventional driver board 18' is also shown. The conventional driver board 18' includes at least a clock signal circuit 20'. The clock signal circuit 20' provides the desired signals for the semiconductor devices to be tested. However, the conventional driver board 18' is to be used with a different manufacturer's conventional burn in system (not shown). Thus, the conventional driver board 18' is not compatible with the conventional burn in system 10'. In other words, the connector 24' for the conventional driver board 18' may not fit into the connector socket 36'. Even if the connector 24' could fit into the connector socket 36', the pins for certain signals on the connector 24' are located in different positions than the pins for the signals on the connector socket 36'. Consequently, without more, the conventional driver board 18' can be used to test semiconductor devices placed in the sockets 14' of the conventional driver board 12'. In a preferred embodiment, the conventional driver board 18' is for a Criteria Rel. Inc. CR-V burn in system, while the conventional burn in system 10' is and AEHR Test 800 burn in system.

The adapter system in accordance with the present invention 100 is used to allow the conventional driver board 18' to function with the conventional burn in system 10'. The adapter system 100 includes an adapteer card 102. The adapter card 102 includes at least a clock signal scrambling circuit 104 and connectors 108 and 110. The connecter 108 has a pin configuration which matches the connector 24' for the conventional driver board 18'. Thus, the connector 24' can be put into the connector 108. The connector 110 has a pin configuration which matches the connector socket 36'. Thus, the connector 110 can be plugged directly into the connector socket 36'. The clock signal scrambling circuit 104 is wired so that a particular pin on the connector 108 is wired to a corresponding pin on the connector 110. As a result, a particular signal from the conventional driver board 18' can be provided to the corresponding pin in the connector socket 36' and, therefore, to the corresponding pin on the conventional burn in board 12'. In other words, the clock signal scrambling circuit 104 on the adapter card 102 allows a particular signal generated by the conventional driver board 18' to be provided to the desired pin in on the conventional burn in board 12' and, therefore, to the correct pin on each of the semiconductor devices plugged into the sockets 14'.

In one embodiment, the clock signal scrambling circuit 104 provides an additional functionality. In such embodiment, the clock signal scrambling circuit 104 is at least partially programmable. This allows the signals provided to be conventional burn in board 12' to be adjusted somewhat. This function is similar to the function of the scrambling circuit that may be provided on some conventional burn-in boards 18'. As a result, different signals may be provided to different pins of the semiconductor devices plugged into the sockets 14'. As a result, different tests might be run on the semiconductor devices plugged into sockets 14'. This functionality increases the flexibility of the conventional burn in system 10' as well as the conventional driver board 18'.

In one embodiment, the adapter card 102 also includes a bias voltage regulator circuit 106. In some conventional burn in systems 10', such as AEHR 800 Test system, the driver board is expected to provide a bias voltage. For example, in the AEHR 800 Test system the driver board is expected to provide a DC bias voltage. The conventional driver board 18' desired to be used to such a conventional burn in system 10' may not include a mechanism for providing a bias voltage. For example, a Criteria Rel. Inc. CR-V burn in system does not include a mechanism for providing a bias voltage. Thus, the adapter card 102 includes a bias voltage regulator circuit 106. In a preferred embodiment, the bias voltage is generated by a bias signal generator circuit 112 that is separate from the adapter card 102. The bias voltage regulator circuit 106 thus regulates the bias voltage to be provided to the conventional burn in board 12'. However, another embodiment, the bias voltage regulator circuit 106 can also generate the voltage. In a preferred embodiment, the bias signal generator circuit 112 also provides an on/off control signal. This allows the semiconductor devices plugged into sockets 14' to be turned on or off separately from the conventional burn in system 10'.

The adapter system 100 improves the flexibility of the conventional burn-in system. The adapter card 102 allows the physical configuration of the connector socket 36' to be matched. In addition, the adapter card 102 allows the signals from the conventional driver board 18' to be provided to the appropriate pins of the connector 110 and, therefore, the connector sockets 34' and 36' as well as the connector 16'. In addition, where warranted, the adapter card 102, perhaps in conjunction with a voltage generating circuit 112, provides a bias voltage to the appropriate pins of the connector 110 and, therefore, the connector sockets 34' and 36' as well as the connector 16'. Thus, the bias voltages and desired signals can be provided to each of the semiconductor devices plugged into the sockets 14 for testing. The adapter system 100, therefore, allows the conventional driver board 18' to be used with a conventional burn-in system 10' with which the conventional driver board 18' would otherwise be incompatible. Thus, the otherwise incompatible conventional driver boards 18' may be configured for different semiconductor devices for which a compatible conventional driver board (not shown) is unavailable. Thus, readily available conventional driver boards for other conventional burn-in systems can be used instead of forcing a user to purchase a new, compatible conventional driver board. In addition, the additional functionalities of providing an on/off bias as well as scrambling the signals can be provided via the adapter card 102. Furthermore, portions of the adapter system 100 may be made using standard off-the shelf electronics components. Thus, providing the adapter system 100 is relatively simple and inexpensive and improves the flexibility of the conventional burn-in system.

Figure 3:
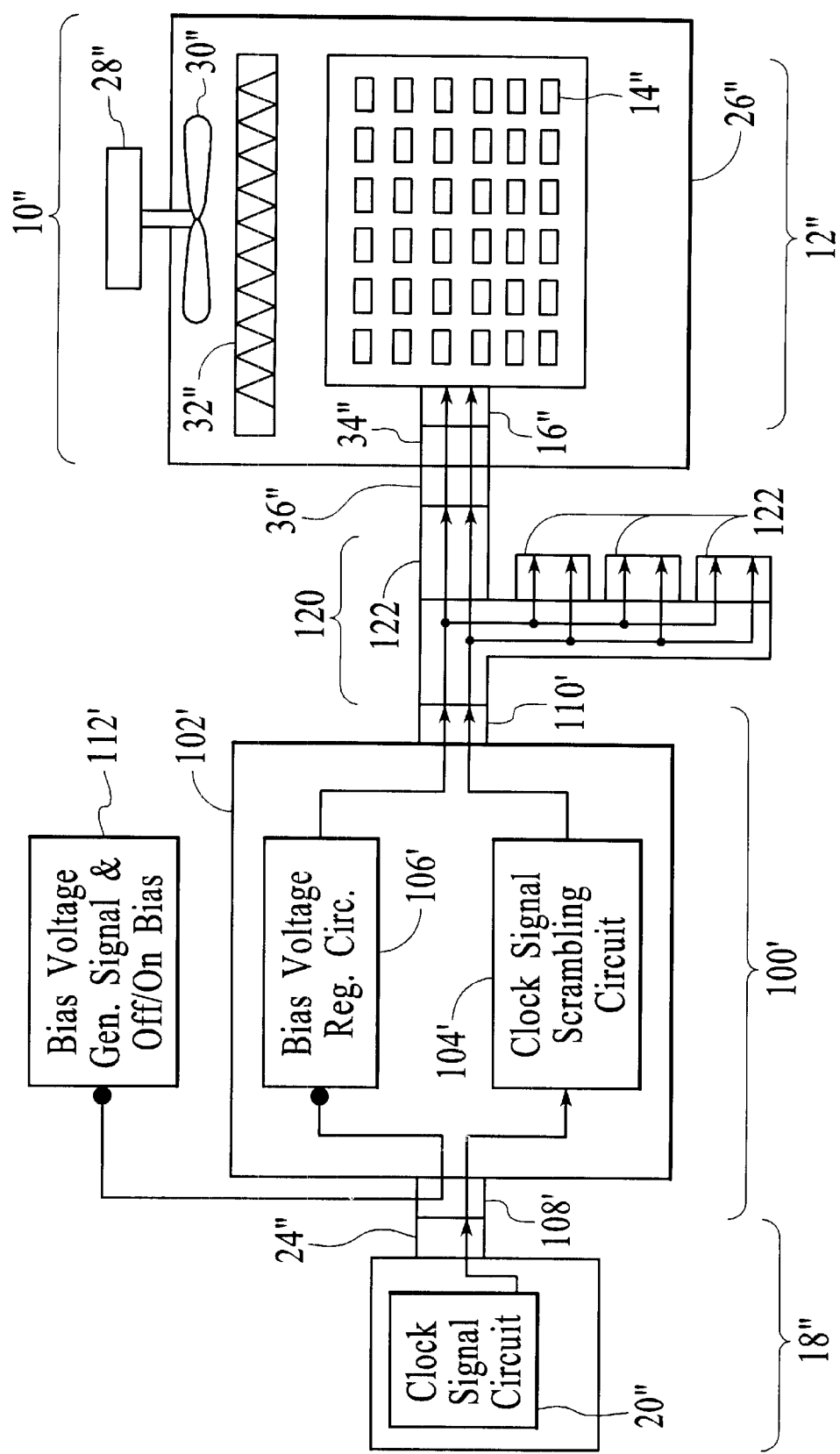
FIG. 3 is a block diagram of another embodiment of the adapter system in accordance with the present invention as used with a conventional burn-in system and driver board.

FIG. 3 is a block diagram of another embodiment of the adapter system 100' in accordance with the present invention as used with a conventional burn-in system 10" and conventional driver board 18". Most of the components of the adapter system 100', the conventional burn-in system 10" and the conventional driver board 18" are the same as the adapter system 100, the conventional burn-in system 10' and the conventional driver board 18', respectively. Consequently, these components are labeled similarly. For example, the adapter card 102' performs essentially the same functions as the adapter card 102 depicted in FIG. 2.

Referring back to FIG. 3, the adapter system 100' also includes a coupler 120. The coupler 120 allows a single conventional driver board 18" to drive multiple burn-in boards 12". In a preferred embodiment, a single conventional driver board 18" for the Criteria Rel. Inc. CR-V system can drive four burn-in boards 12" for the AEHR 800 Test system. Thus, the coupler 120 is shown having four connectors 122. For clarity, however, only one of the connecters 122 is coupled with a conventional burn-in board 12". In addition, nothing prevents the use of another number of connectors 122 for coupling the conventional driver board 18" with the appropriate number of conventional burn-in boards. Thus, the coupler 120 can couple the conventional driver board 18" to four conventional burn-in boards 12". In a preferred embodiment, the coupler 120 includes a standard data cable with four connecters 122 that are configured to be plugged into the connector sockets 36". The components of the coupler 120 and connectors 122 are preferably made using standard off the shelf electronic components. Thus, using the adapter system 100", the conventional driver board 18" can be used to drive multiple conventional burn-in boards 12" for a conventional burn-in 10" with which the conventional driver board 18" would otherwise be incompatible. Because multiple conventional burn-in boards 12" can be driven, fewer conventional driver boards 18" are required. In addition, the adapter system 100' improves the flexibility of the conventional burn-in system 10"in a similar manner to the adapter system 100.

A method and system has been disclosed for adapting driver boards from one burn-in system to another, otherwise incompatible burn-in system. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An adaptor system for use with a first burn-in system, the first burn-in system including a heating chamber and a plurality of burn-in boards for use in the heating chamber, each of the plurality of burn-in boards for holding a plurality of semiconductor devices for testing in the first burn-in system, each of the plurality of burn-in boards having a first connector for receiving a plurality of signals for a first portion of the plurality of semiconducter devices, each of the plurality of signals being received in a first corresponding portion of the first connector, the adaptor system comprising:

an adaptor card for use with the first burn-in system and a driver board for a second burn-in system, the driver board being incompatible with the first burn-in system, the driver board having a second connector for outputting the plurality of signals, each of the plurality of signals being provided in a second corresponding portion of the second connector, the adapter card including a scrambling circuit for providing an interface between the second connector and the first connector such that each of the plurality of signals can be provided from the second corresponding portion of the second connector to the first corresponding portion of the first connector of at least one burn-in board of the plurality of burn-in boards, the adaptor card allowing the driver board to be used in the first burn-in system;

wherein the driver board is configured for use with the second burn-in system and is compatible with the second burn-in system, the first burn-in system being incompatible with the second burn-in system.

2. The adapter system of claim 1 wherein the adapter card further includes:

a third connecter coupled with the scrambling circuit, the third connector configured to be coupled with the first connector; and a fourth connecter coupled with the scrambling circuit, the fourth connector configured to be coupled with the second connector.

3. The adapter system of claim 1 wherein the adapter card further includes:

a voltage circuit for providing a voltage to the at least one burn-in board via the first connector and the second connector.

4. The adapter system of claim 3 wherein the voltage circuit is for providing a DC voltage to the at least one burn-in board.

5. The adapter system of claim 4 further comprising:

a DC voltage bias circuit coupled with the voltage circuit, the DC voltage bias circuit for providing the DC voltage to the voltage circuit.

6. The adapter system of claim 1 wherein the at least one burn-in board includes four burn-in boards and wherein the adapter system further includes:

a cable adapter for allowing the driver board to be used with the four burn-in boards.

7. The adapter system of claim 1 wherein the first burn-in system is an AEHR burn-in system.

8. The adapter system of claim 6 wherein the second burn-in system is a Criteria Rel. Inc. burn-in system.

9. The adapter system of claim 1 wherein the adapter card further includes:

a third connecter coupled with the scrambling circuit, the third connector configured to be coupled with the first connector; and a fourth connecter coupled with the scrambling circuit, the fourth connector configured to be coupled with the second connector.

10. A method for using a first burn-in system, the first burn-in system including a heating chamber and a plurality of burn-in boards for use in the heating chamber, each of the plurality of burn-in boards for holding a plurality of semiconductor devices for testing in the first burn-in system each of the plurality of burn-in boards having a first connector for receiving a plurality of signals for a first portion of the plurality of semiconductor devices, each of the plurality of signals being received in a first corresponding portion of the first connector, the method comprising the steps of:

(a) plugging an adaptor card into the first burn-in system, the adapter card for use with the first burn-in system and a driver board for a second burn-in system, the driver board being incompatible with the first burn-in system, the driver board having a second connector for outputting the plurality of signals, each of the plurality of signals being provided in a second corresponding portion of the second connector, the adaptor card including a scrambling circuit for providing an interface between the second connector and the first connector such that each of the plurality of signals can be provided from the second corresponding portion of the second connector to the first corresponding portion of the first connector of at least one burn-in board of the plurality of burn-in boards, the adaptor card allowing the driver board to be used in the first burn-in system;

(b) plugging the driver board into the adapter card; and (c) performing at least one test on the plurality of semiconductor devices using the driver board and the adapter card;

wherein the driver board is configured for use with the second burn-in system and is compatible with the second burn-in system, the first burn-in system being incompatible with the second burn-in system.

11. The method of claim 10 wherein the adapter card further includes a voltage circuit for providing a voltage to the at least one burn-in board via the first connector and the second connector.

12. The method of claim 10 wherein the voltage circuit is for providing a DC voltage to the at least one burn-in board.

13. The method of claim 10 further comprising the step of:
   (d) providing the DC voltage to the adapter card using a DC voltage bias circuit coupled with the voltage circuit, the DC voltage bias circuit for providing the DC voltage to the voltage circuit.

14. The method of claim 11 wherein the at least one burn-in board includes four burn-in boards and wherein the method further includes the step of:
   (d) providing a cable adapter for allowing the driver board to be used with the four burn-in boards.

15. The method of claim 10 wherein the first burn-in system is an AEHR burn-in system.

16. The method of claim 15 wherein the second burn-in system is a Criteria Rel. Inc. burn-in system.

* * * * *